United States Patent [19]

Ebe et al.

[11] Patent Number: 4,965,127

[45] Date of Patent: * Oct. 23, 1990

[54] ADHESIVE SHEETS

[75] Inventors: Kazuyoshi Ebe; Hiroaki Narita; Katsuhisa Taguchi; Yoshitaka Akeda; Takanori Saito, all of Saitama, Japan

[73] Assignee: FSK Kabushiki Kaisha, Tokyo, Japan

[*] Notice: The portion of the term of this patent subsequent to Jul. 12, 2005 has been disclaimed.

[21] Appl. No.: 111,849

[22] Filed: Oct. 22, 1987

Related U.S. Application Data

[63] Continuation of Ser. No. 932,210, Nov. 18, 1986, Pat. No. 4,756,968.

[30] Foreign Application Priority Data

Dec. 27, 1985 [JP] Japan ................................ 60-295188
Dec. 27, 1985 [JP] Japan ................................ 60-295189
Dec. 27, 1985 [JP] Japan ................................ 60-295190
Mar. 3, 1986 [JP] Japan ................................ 61-045785
Mar. 3, 1986 [JP] Japan ................................ 61-045786
Jul. 9, 1986 [JP] Japan ................................ 61-161680

[51] Int. Cl.$^5$ ........................ C09J 7/02; C09J 133/08; C09J 133/10
[52] U.S. Cl. .................................. 428/343; 428/345; 430/338

[58] Field of Search ................ 428/343, 345, 901; 430/338; 427/35, 59.1

[56] References Cited

U.S. PATENT DOCUMENTS 4,311,759 11/1982 Glennon.
4,598,036 7/1986 Iwasaki et al. ............ 430/338 X
4,756,968 7/1988 Ebe et al. ............... 428/345

FOREIGN PATENT DOCUMENTS 9179674 10/1984 Japan ................................ 428/345
1028572 2/1986 Japan ................................ 428/345

Primary Examiner—George F. Lesmes
Assistant Examiner—J. Davis
Attorney, Agent, or Firm—Wenderoth, Lind & Ponack

[57] ABSTRACT

An adhesive sheet according to the present invention comprises a substrate having coated on the surface thereof an adhesive layer consisting of an adhesive and a radiation polymerizable compound, which compound is a urethane acrylate oligomer having a molecular weight of 3,000–10,000, preferably 4,000–8,000. The adhesive sheet is preferably used in subjecting semiconductor wafers to dicing operation and no adhesive sticks to and remains on the back side surface of the wafer chips as picked up.

10 Claims, 2 Drawing Sheets

ADHESIVE SHEETS

This application is a continuation of Ser. No. 932,210 filed Nov. 18, 1986, now U.S. Pat. No. 4,756,968.

FIELD OF THE INVENTION

This invention relates to adhesive sheets and, were particularly, to adhesive sheets which are preferably used in dicing semiconductor wafers into chips.

BACKGROUND OF THE INVENTION

Semiconductor wafers of silicon, gallium-arsenic, etc., are produced normally in their state of being relatively large in diameter, and the wafers are diced into chips, which are then transferred to the subsequent mounting stage. At this time, the semiconductor wafers are subjected in their state of being previously applied to an adhesive layer of an adhesive sheet to such stages as dicing, rinsing, drying, expanding, picking-up and mounting.

Adhesive sheets which have heretofore been used in the dicing stage of semiconductor wafers as mentioned above include those which comprise a substrate such as a vinyl chloride or polypropylene film or sheet and thereon an adhesive layer consisting essentially of such an adhesive as an acrylic adhesive or the like. In the adhesive sheets having an acrylic adhesive layer, however, there was involved such a problem that the chips were contaminated on the back side surface thereof with the adhesive which had adhered to and remained thereon.

In order to solve the problem mentioned above, there has been proposed a process where an adhesive applied to the surface of an adhesive sheet is minimized by coating a substrate of the adhesive sheet, not wholly but partly, with the adhesive. According to this process, however, there is brought about such a new problem that because of a decrease in adhesion strength between wafer chips and adhesive sheet, the wafer chips peel off from the adhesive sheet during stages subsequent to the dicing stage, such as rinsing, drying and expanding, though the amount of the adhesive used relative to the full number of the chips decreases and thereby lessens contamination of the back side surface of the chips with the adhesive to a certain extent.

Adhesive sheets which are intended for use in the processing stage of semiconductor wafer, from the dicing stage up to the pick-up stage, are desired to be such that the adhesive sheets have an adhesion force sufficient to retain wafer chips thereon in the course from the dicing stage up to the expanding stage, but in the pick-up stage, they only retain their adhesion force to such an extent that no adhesive sticks to the back side surface of picked-up wafer chips.

PCT/US80/00822 patent application discloses normally tacky and pressure-sensitive adhesive including oxirane rings and an ionic photoinitiator characterized in that the epoxy equivalent value of the adhesive is 400–900 and the ionic photoinitiator is selected from the group consisting of radiation-sensitive aromatic onium salts of Group Va or VIa; onium catalysts of Group Va, VI or VIIa, diaryl halonium salts containing Group Va metal hexafluorides and triaryl sulfonium complex salts and is present in an amount effective to promote the polymerization of oxirane rings, whereby said adhesive is readily detackified by exposure to actinic radiation.

Further Japanese Patent Laid-Open Publication Nos. 196956/1985 and 223139/1985 disclose adhesive sheets which are alleged to satisfy the above-mentioned requirements, said adhesive sheets comprising a substrate having coated on the surface thereof an adhesive consisting essentially of a low molecular compound having in the molecule at least two photopolymerizable carbon-carbon double bonds and capable of exhibiting a three-dimensional network on irradiation of light. The low molecular compounds having in the molecule at least two photopolymerizable carbon-carbon double bonds as exemplified in the above-mentioned publications include trimethylolpropane triacrylate, tetramethylolmethane tetraacrylate, pentaerythritol triacrylate, pentaerythritol tetraacrylate, dipentaerythritol monohydroxy pentaacrylate, dipentaerythritol hexaacrylate, 1,4-butyleneglycol diacrylate, 1,6-hexanediol diacrylate, polyethylene glycol diacrylate, commercially available oligoester acrylates, etc.

We have found that the adhesive sheets comprising a substrate having coated thereon an adhesive layer consisting essentially of such low molecular compound having in the molecule at least two photopolymerizable carbon-carbon double bonds as exemplified above involve problems as mentioned below.

(1) Such an adhesive sheet as mentioned above can exhibit an excellent performance to a certain extent when a semiconductor wafer to be applied to the adhesive sheet has a fine and smooth surface like a mirror surface. If the wafer surface is rough, however, there is observed such a problem that even when irradiation of such radiation as ultraviolet ray is effected in the pick-up stage, the adhesion strength between the wafer chips and adhesive sheet does not decrease sufficiently and accordingly the adhesive sticks to and remains on the back side surface of the chips.

(2) Where a semiconductor wafer applied onto an adhesive layer of an adhesive sheet is diced into wafer chips and the diced chips are then picked up, the position of the chip has been detected by means of a photosensor. In the above-mentioned adhesive sheet, however, there is observed such a problem that because the adhesive sheet reflects the detection beam at the chip's position, the detection operation of the chip cannot be performed with satisfactory accuracy and a failure in the detection operation sometimes occurs.

(3) Where the wafer surface to which an adhesive layer of an adhesive sheet is applied is greyed or blackened for some reason or other, there is involved such a problem that even when the adhesive sheet is irradiated with radiation such as ultraviolet ray in the pick-up stage of the semiconductor wafer chips, the adhesion force of the portions of the adhesive layer of the adhesive sheet corresponding to the portions of the greyed or blackened portions of the wafer does not decrease sufficiently and accordingly the adhesive adheres to and remains on the back side surface of the wafer chips.

(4) In the adhesive sheet as mentioned above, there is observed such a problem that the adhesive force certainly decreases but not to the optimum level, thus the larger the size of the chips, the more difficult the pick-up operation becomes.

(5) In the above-mentioned adhesive sheets, there is observed such a problem that because such a general-purpose polymer sheet as of polyvinyl chloride or polypropylene is used as a substrate sheet in said adhesive sheets, a tensile force is applied to said adhesive sheets when wafers are applied onto said adhesive sheets or when the thus applied wafers are diced into chips, and the substrate sheet undergoes elongation after the completion of the dicing stage of the wafers, whereby a deflection occurs in the adhesive sheets and the thus deflected adhesive sheets cannot be received by a wafer box for transferring said adhesive sheet to the subsequent processing operation, or the received wafers mutually contact with one another in the wafer box. Furthermore, there is also observed such a problem that when the adhesive sheets, after the completion of the dicing operation of the wafers applied onto said adhesive sheets, are subjected to irradiation with radiation such as ultraviolet ray, an elongation or deflection occurs afresh in the irradiated adhesive sheets, or such elongation or deflection which has occurred once in the adhesive sheets in the dicing stage of the wafers as mentioned previously is sometimes retained, as it was, in the irradiated adhesive sheets, and hence said irradiated adhesive sheets cannot be received by a wafer box for transferring said adhesive sheets to the subsequent pick-up stage, or the received wafers mutually contact with one another in the wafer box.

OBJECTS OF THE INVENTION

The present invention is intended to solve such technical problems associated with the prior art as mentioned above and its objects are as in the following.

A first object of the invention is to provide adhesive sheets which are preferably used, particularly in subjecting semiconductor wafers to dicing operation, said adhesive sheets being such that even if the wafer surface to be applied onto an adhesive layer of the adhesive sheets is rough, the adhesion force of the adhesive layer sufficiently decreases when the adhesive sheets are subjected in the pick-up stage of semiconductor wafer chips to irradiation with such radiation as ultraviolet ray and accordingly no adhesive sticks to and remains on the back side surface of wafer chips as picked up.

A second object of the invention is to provide adhesive sheets which are preferably used, particularly in subjecting semiconductor wafers to dicing operation, said adhesive sheets being such that when wafer chips are picked up from the adhesive sheets, the detection of the chips by means of a photosensor can be performed with satisfactory accuracy and accordingly no failure in operation for positioning the wafer chips occurs, moreover, an adhesive layer of the adhesive sheets has a sufficient adhesive force before ultraviolet ray irradiation of the adhesive sheets but retains a sufficiently decreased adhesion force after the irradiation and no adhesive sticks to the back side surface of the wafer and, furthermore, an operator supervising the dicing operation can easily ascertain whether or not the adhesive sheets have been irradiated with the radiation, thereby preventing possible troubles in operation before they happen.

A third object of the invention is to provide adhesive sheets which are preferably used, particularly in subjecting semiconductor wafers to dicing operation, said adhesive sheets being such that even when the wafer surface to which an adhesive layer of adhesive sheets is applied is greyed or blackened for some reason or other, an adhesion force of the adhesive layer at the portions thereof corresponding to the greyed or blackened portions of the wafers sufficiently decreases in the pick-up stage of semiconductor wafer chips where the adhesive sheets are subjected to irradiation with such radiation as ultraviolet ray and accordingly no adhesive sticks to and remains on the wafer chip surface and, moreover, said adhesive layer has a sufficient adhesion force before the ultraviolet ray irradiation of the adhesive sheets.

A fourth object of the invention is to provide adhesive sheets which are such that in the wafer dicing stage, no elongation or deflection occurs in a substrate sheet of the adhesive sheets onto which the wafers have been applied, no elongation or deflection occurs afresh in the adhesive sheets having the diced wafer chips thereon even when said adhesive sheets are irradiated with radiation and, moreover, even when a slight elongation or slight deflection occurs in the substrate sheet in the dicing stage, said deflection disappears by virtue of passing the adhesive sheets through the irradiation operation and the resulting adhesive sheets can be received with accuracy by a receiving box.

SUMMARY OF THE INVENTION

A feature of the adhesive sheets of the present invention is that said adhesive sheets comprise a substrate having coated on the surface thereof an adhesive layer consisting essentially of an adhesive and a radiation polymerizable compound, said radiation polymerizable compound being a urethane acrylate oligomer having a molecular weight of 3,000-10,000, preferably 4,000-8,000.

A further feature of the adhesive sheets of the invention is that said adhesive sheets comprise a substrate having coated on the surface thereof an adhesive layer consisting essentially of an adhesive and a radiation polymerizable compound which is a urethane acrylate oligomer, said adhesive layer being incorporated with a radiation color developable compound, or said substrate being coated at least on one side thereof with a radiation color developable compound, or said substrate being incorporated with a radiation color developable compound.

Another feature of the adhesive sheets of the invention is that said adhesive sheets comprise a substrate having coated on the surface thereof an adhesive layer consisting essentially of an adhesive and a radiation polymerizable compound which is a urethane acrylate oligomer, said adhesive layer being incorporated with powder of a light scattering inorganic compound.

A still further feature of the adhesive sheets of the invention is that said adhesive sheets for application of semiconductor wafers thereonto comprise a substrate having coated on the surface thereof an adhesive layer consisting essentially of an adhesive and a radiation polymerizable compound which is a urethane acrylate oligomer, said substrate being a crosslinked film.

DETAILED DESCRIPTION OF THE INVENTION

The adhesive sheets of the present invention are illustrated below in detail with reference to the accompanying drawings.

Figure 1:
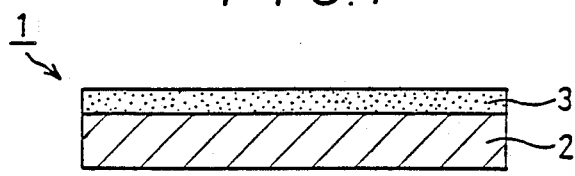
FIGS. 1 and 2 are sectional views of the adhesive sheets of the present invention.
Figure 2:
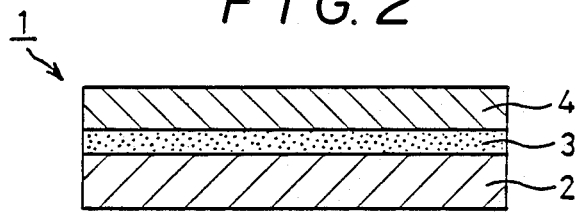
Figure 3:
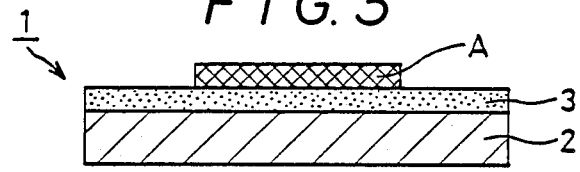
FIGS. 3-6 are illustrations showing said adhesive sheets used in the course from the dicing stage of semiconductor wafers up to the pick-up stage of diced wafers.
Figure 4:
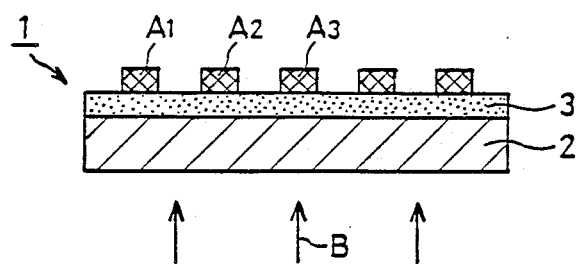
Figure 5:
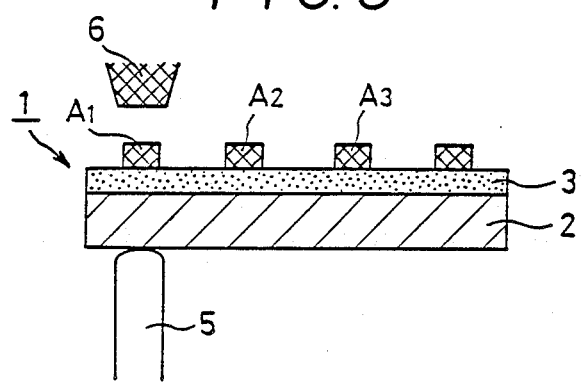

As can be seen from its sectional view shown in FIG. 1, the present adhesive sheet 1 is composed of a substrate 2 and an adhesive layer 3. Before use of this adhesive sheet, it is preferable to tentatively apply a strippable sheet 4 as shown in FIG. 2 in order to protect the adhesive layer 3.

The present adhesive sheet may be shaped into any form such as a tape-like, label-like or other form. Suitable as the substrate 2 are materials which are low in electrical conductivity and excellent in water resistance as well as in heat resistance, and on this view, synthetic resin films are particularly useful. As will be stated later, the present adhesive sheet is, when used, irradiated with such radiation as EB or UV, and hence the substrate 2 is not required to be transparent when said adhesive sheet is subjected to EB irradiation but must be transparent when said adhesive sheet is subjected to UV irradiation.

Practically speaking, usable as the substrate 2 are films of such synthetic resins as polyethylene, polypropylene, polyvinyl chloride, polyethylene terephthalate, polybutylene terephthalate, polybutene, polybutadiene, polyurethane, polymethyl pentene, ethylene vinyl acetate, etc.

Where the present adhesive sheet requires, after the dicing of semiconductor wafers, an expansion treatment, it is preferable to use as a substrate in the conventional manner a synthetic resin film of polyvinyl chloride, polypropylene or the like which has extensibility in the machine and cross machine directions. However, any substrates having no extensibility are also usable in the case of the treatment processing semiconductors or masking automobile body or the like where no such expanding treatment is needed.

When a crosslinked film is used, particularly as the substrate 2, there are obtained such great advantages that no extension or deflection occurs in the adhesive sheet having applied wafers thereonto when the wafers are diced, no deflection occurs afresh in the adhesive sheet when said adhesive sheet is irradiated with radiation and moreover, even when a slight deflection occurs in the adhesive sheet in the wafer dicing stage, said slight deflection diminishes on irradiation of the substrate sheet with radiation and accordingly the adhesive sheet bearing the diced wafers thereon can assuredly be received by a receiving box wherein no mutual contact of the adhesive sheets is observed. Moreover, when the diced wafer chips are picked up after irradiation, the substrate sheet sufficiently extends at the time of expanding, and hence the wafer chips can be picked up with accuracy.

The crosslinked films which are preferably used, particularly as the substrate in the present invention are those which have been obtained by irradiating synthetic resin films having crosslinking sites with radiation or those which have been obtained by incorporating crosslinking-reaction-initiators into starting polymers which are then chemically crosslinked. Usable as the crosslinked films as mentioned above are films of crosslinked polyolefin, crosslinked polydiene, crosslinked ethylene-vinyl acetate copolymers or crosslinked polyolefin-polydiene copolymers.

Such crosslinked films used as the substrates in the present invention are subjected to expanding treatment at the time when diced wafer chips are picked up, and these films have extensibility sufficient to meet the expanding treatment, whereby the wafer chips can be picked up with accuracy.

Further, synthetic resin films having carboxyl groups as principal constituent monomer units are preferably used as the substrate 2. Such synthetic resin films having carboxyl groups as principal constituent monomer units include ethylene(metha)acrylic acid copolymer and ethylene-vinyl acetate(meta)acrylic acid copolymer. In addition, a laminate film comprising the synthetic resin film having carboxylic groups as principal constituent monomer units and a general synthetic resin film such as polyethylene, ethylene-vinyl acetate copolymer, polypropylene, polybutene, polybytadiene, polyvinylchloride, polyurethane, polymethyl pentene can be used.

On the substrate 2 as illustrated above is provided the adhesive layer 3 which is composed of an adhesive and a radiation polymerizable compound.

Acrylic adhesives are preferably used as the adhesives in the present invention, though a wide variety of conventionally known adhesives are usable. Practically speaking, the acrylic adhesives referred to in the present invention are acrylic polymers selected from homopolymers and copolymers comprising acrylic esters as principal constituent monomer units, copolymers of acrylic esters and other functional monomers, and mixtures thereof. The polymers preferably usable are those containing, as acrylic ester monomers, ethyl methacrylate, butyl methacrylate, 2-ethylhexyl methacrylate, glycidyl methacrylate, 2-hydroxyethyl methacrylate, etc., and the above-mentioned monomers containing acrylic acid esters instead of methacrylic acid esters are also preferably usable.

Furthermore, in order to enhance miscibility with the oligomers which will be mentioned later, the above-mentioned polymers may be those obtained by copolymerization of such monomers as (metha) acrylic acid, acrylonitrile and vinyl acetate. The above-mentioned polymers used as the adhesives in the present invention have a molecular weight of $2.0 \times 10^5$ to $10.0 \times 10^5$, preferably $4.0 \times 10^5$ to $8.0 \times 10^5$.

In the present invention urethane acrylate oligomers are used as radiation polymerizable compound. The molecular weight of the urethane acrylate oligomer is 3,000–10,000, preferably 4,000–8,000. The molecular weight referred to above is a value as an average molecular weight of polystyrene as measured by gel permeation chromatography (GPC).

The urethane acrylate oligomers are obtained by reacting terminal isocyanate urethane prepolymers obtained by the reaction of polyester or polyether type polyol compounds with polyvalent isocyanate compounds, for example, 2,4-tolylene diisocyanate, 2,6-tolylene diisocyanate, 1,4-xylylene diisocyanate and diphenylmethane 4,4'-diisocyanate, with (metha)acrylates having hydroxyl groups, for example, 2-hydroxyethyl (metha)acrylate, 2-hydroxypropyl (metha)acrylate, polyethyle glycol (metha)acrylate, etc. The urethane acrylate oligomers as obtained above are radiation polymerizable compounds having in the molecule at least one carbon-carbon double bond.

It is not preferable to use the urethane acrylate oligomers having a molecular weight of less than 3000. This is because, though no serious problem is brought about when semiconductor wafers used have a fine or smooth surface, when the wafers have a rough surface, the adhesion strength between the wafer chips and adhesive sheet does not decrease sufficiently even when the adhesive sheet is irradiated with radiation and the adhesive sometimes adheres to and remains on the back side surface of the wafer chips when they are picked up. The fact that when the urethane acrylate oligomer having a molecular weight of less than 3000 is used, the adhesive adheres to the back side surface of wafer chips when the wafer has a rough surface is considered ascribable to the following reason. That is, the rough surface of the wafer means that a large number of fine grooves are present on the wafer surface, and when the urethane acrylate oligomer is brought into contact with such rough surface of the wafer, said oligomer intrudes into these fine grooves if said oligomer is low in molecular weight. On that account, it is considered that even when such oligomer is sufficiently cured by irradiation with radiation, the adhesion strength is kept at a high level by the anchoring effect of the adhesive and accordingly the adhesive adheres to and remains on the back side surface of wafer chips when the chips are picked up.

Thus, we found first the above-mentioned problem concerning the molecular weight of urethane acrylate oligomers, and it is almost a truism to say that all compounds concretely disclosed, for example, in the aforementioned Japanese Patent Laid-Open Publication No. 196956/1985 or No. 223139/1985, as the low molecular compounds having in the molecule at least two photopolymerizable carbon-carbon double bonds have a molecular weight of less than about 1500. The fact that these compounds low in molecular weight have heretofore been used is considered accountable for poor coatability of the compounds having excessively high molecular weights or deterioration in the surface gloss of coatings formed from such high molecular compounds.

In this connection, the urethane acrylate oligomers used in the present invention possess markedly excellent properties, as compared with low molecular compounds having in the molecule at least two photopolymerizable carbon-carbon double bonds as disclosed in Japanese Patent Laid-Open Publications Nos. 196956/1985 and 223139/1985. For instance, adhesive sheets prepared by the use of the present urethane acrylate oligomers show that the adhesive layer of the thus prepared adhesive sheets has a sufficient adhesion force before irradiation of said sheets with radiation but after the irradiation it decreases in adhesion force to such a level that the adhesive does not adhere to the chips and hence the chips can simply be picked up. In contrast thereto, adhesive sheets prepared by the use of dipentaerythritol monohydroxy pentaacrylate as disclosed in the examples of Japanese Patent Laid-Open Publication No. 196956/1985 show that the adhesive layer of the thus prepared adhesive sheets exhibits a sufficient adhesion force before irradiation of said sheets with radiation but does not decrease in adhesion force sufficiently even after the irradiation and the adhesive adheres to and remains on the back side surface of wafer chips when the chips are picked up.

In the adhesive layer of the adhesive sheet in accordance with the present invention, the acrylic adhesive and the urethane acrylate oligomer are used preferably in the proportion of 100 to 50–900 parts by weight. In that case, the adhesive sheet obtained is high in initial adhesion force and, moreover, the initial adhesion force greatly decreases after irradiation of said sheet with radiation and hence the wafer chips can readily be picked up from the adhesive sheet.

In an another embodiment of the adhesive sheet of the present invention, the adhesive layer 3 contains therein a radiation color developable compound in addition to the acrylic adhesive and radiation polymerizable compound mentioned above, or the substrate 2 of the above-mentioned adhesive sheet is coated at least on one side thereof with a radiation color developable layer containing a radiation color developable compound. Under certain circumstances, a radiation color developable compound may be incorporated in the substrate 2.

In this embodiment, as radiation polymerizable compound, although the urethane acrylate oligomers are preferably used, conventionally known radiation polymerizable compounds except the urethane acrylate oligomers are also usable. Such radiation polymerizable compounds except the urethane acrylate oligomers include trimethylolpropane acrylate, tetramethylolmethane tetraacrylate, pentaerythritol triacrylate, pentaerythritol tetraacrylate, dipentaerythritol monohydroxy pentaacrylate, dipentaerythritol hexaacrylate, 1,4-butyleneglycol diacrylate, 1,6-hexanediol diacrylate, polyethylene glycol diacrylate, commercially available oligoester acrylates.

The radiation color developable layer containing the radiation color developable compound may be formed on the side of the substrate 2 on which the adhesive layer 3 is not formed, or may be formed between the substrate 2 and the adhesive layer 3.

The radiation color developable compounds used in the present invention are compounds which are colorless or palecolored before irradiation with radiation but develop color on irradiation with radiation, and preferred examples of such compounds are leuco dyes. Preferably usable as the leuco dyes are those which are conventionally used compounds such as triphenyl methane, fluoran, phenothiazine, Auramine, and spiropyrane compounds. These compounds include, for example, 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4''-trisdimethylaminotriphenyl methanol, 4,4',4''-trisdimethylaminotriphenyl methane, etc.

Developers preferably usable in combination with the above-mentioned leuco dyes are those which have heretofore conventionally been used, such as initial polycondensation products of phenol-formalin resin, aromatic carboxylic acid derivatives and electron acceptors such as activated clay, and further when the developed color is intended to vary in color tone, various known color formers can also be used in combination therewith.

The radiation color developable layer containing the radiation color developable compound mentioned above can be formed at least on one side of the substrate 2 by coating a solution of said compound in an organic solvent either on one side or both sides of the substrate 2.

The radiation color developable layer may be formed by incorporating the radiation color developable compound in a subbing composition and then coating the subbing composition at least on one side of the substrate 2. Though suitably selected according to the type of the substrate 2 used, the subbing compositions mentioned above include those consisting essentially of vinyl acetate-vinyl chloride copolymers, polyurethane resins, polyester resins, polyamide resins or epoxy resins.

In another aspect, the above-mentioned solution of the radiation color developable compound in an organic solvent may be incorporated in the substrate 2 by using said solution at the time when the material for the substrate 2 is formed into a sheet-like product. Under certain circumstances, the radiation color developable compound may also be incorporated in the form of fine powder into the substrate 2.

By virtue of incorporating the radiation color developable compound into the adhesive layer 3, or coating said compound at least on one side of the substrate 2, or by incorporating said compound into the substrate 2 in the manner now described, the adhesive sheet 1 is sufficiently colored on irradiation with radiation, whereby the detection accuracy is enhanced at the time of detecting wafer chips by means of a photosensor and a possible failure in operation to pick up the wafer chips from the adhesive sheet 1 is prevented.

By coating the radiation color developable compound at least on one side of the substrate 2, there is also obtained such an advantage that in comparison with the case of incorporation in the adhesive layer 3 of said compound, there is no possibility of exerting adverse effect on the expected decrease in adhesion force of the adhesive layer 3 by irradiation with radiation.

In another embodiment of the adhesive sheet of the present invention, the adhesive layer 3 preferably contains therein powder of a light scattering inorganic compound in addition to the adhesive and the radiation polymerizable compound.

In this embodiment, in addition to the urethane acrylate oligomers, conventionally known radiation polymerizable compounds are also usable.

The light scattering inorganic compounds being referred to above are such compounds as capable of irregular reflection of radiation of ultraviolet ray (UV) or electron beam (EB), which concretely include, for example, silica powder, alumina powder, silica alumina powder or mica powder. The light scattering inorganic compounds are preferably those which reflect such radiation as mentioned above almost perfectly, but those which absorb the radiation to a certain extent are of course usable.

Preferably, the light scattering inorganic compounds are in the form of powder and have a particle diameter of 1-100 $\mu$m, preferably about 1-20 $\mu$m. In the adhesive layer, this light scattering inorganic compound is desirably used in an amount of 0.1-10%, preferably 1-4% by weight. The use of this light scattering inorganic compound in an amount exceeding 10% by weight is not preferable since the adhesive layer delate sometimes reduce the adhesion force and, on the other hand, the use of said compound in an amount less than 1% by weight is also not preferable since the adhesive layer does not sufficiently lower adhesion force even when irradiation is effected to the portions of the adhesive layer corresponding to the greyed or blackened portions of semiconductor wafer surface, if there is any, and the adhesive adheres to and remains on the wafer chip surface when the chips are picked up from the adhesive sheet.

Even when semiconductor wafers having the surface greyed or blackened for some reason or other are applied to adhesive sheets having an adhesive layer containing powder of the above-mentioned light scattering inorganic compound in addition to the adhesive and radiation polymerizable compound, the adhesion force of this adhesive layer sufficiently decreases even at the portions corresponding to the greyed or blackened portions of the wafer surface when irradiated with radiation, and the reason for this is considered to be as follows. That is, the adhesive sheet 1 of the present invention has thereon the adhesive layer 3, and when this adhesive layer 3 is irradiated with radiation, the radiation polymerizable compound contained in the adhesive layer 3 comes to cure and this adhesive layer 3 decreases in adhesion force. In that case, however, the semiconductor wafers to be applied to the adhesive layer 3 have sometimes on the surface thereof portions greyed or blackened for some reason or other. In that case, when the adhesive layer is irradiated with radiation, the radiation passes through the adhesion layer to reach the wafer surface, however, if the wafers have greyed or blackened portions, the radiation is absorbed by said portions and does not reflect. On that account, it follows that the radiation which is to be utilized to cure the adhesive layer 3 is absorbed by the portions corresponding to the greyed or blackened portions of the wafer surface, and this adhesive layer 3 does not cure sufficiently and does not sufficiently decrease in adhesion force. Accordingly, it is considered that the adhesive adheres to and remains on the back side surface of wafer chips when the chips are picked up from the adhesive sheet.

When powder of the light scattering inorganic compound is incorporated into the adhesive layer 3, however, the radiation as irradiated comes into irregular reflection by and is altered in its direction before reaching the wafer surface. On that account, even if greyed or blackened portions are present in the wafer chip surface, the irregularly reflected radiation sufficiently permeates into the upper region of portions of the adhesive layer corresponding to said greyed or blackened portions and accordingly the corresponding portions of the adhesive layer cure sufficiently. By virtue of incorporating the light scattering inorganic compound powder into the adhesive layer, even when portions greyed or blackened for some reason or other are present in the semiconductor wafer surface, the adhesive layer does not cure insufficiently at its portions corresponding to the greyed or blackened portions of the wafer chip surface and accordingly the adhesive will not adhere to and remain on the chip surface when the chips are picked up from the adhesive sheet.

Furthermore, the initial adhesive force of the above-mentioned adhesive layer can be altered to any desired level by incorporating an isocyanate type hardener into said adhesive layer. Usable as the isocyanate type hardeners in the above case are polyvalent isocyanate compounds, for example, 2,4-tolylene diisocyanate, 2,6-toluylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicylcohexyl-methane-4,4'diisocyanate, dicyclohexylmethane-2,4'-diisocyanate and lysine isocyanate.

Furthermore, the above-mentioned adhesive layer may be incorporated with a UV curing initiator when said layer is subjected to UV irradiation, thereby shortening the polymerization curing time by U.V. irradiation and minimizing the amount of UV irradiation.

Concrete examples of such U.V. curing initiators include, for example, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, $\beta$-chloroanthraquinone, etc.

The adhesive sheet of the present invention is illustrated below, by reference to the drawings, with respect to the method of use thereof.

Where the strippable sheet 4 is provided on the adhesive sheet 1, said sheet 4 is first removed and the adhesive sheet 1 is placed, turning the adhesive layer 3 upward. On the face side of this adhesive layer 3 is applied the semiconductor wafer A to be subjected later to dicing. The wafer A is subjected in this state to such processing operations as dicing, rinsing, drying and expanding. In that case, the wafer chips will not fall off from the adhesive sheet 1 during each operation because the wafer chips are sufficiently attached to and held on the adhesive sheet 1 by means of the adhesive layer 3.

Subsequently, the wafer chips are picked up from the adhesive sheet 1 and mounted on a given support substrate. In that case, before the pick-up operation or at the time when the pick-up operation is carried out, the adhesive layer 3 of the adhesive sheet 1 is irradiated with an electrodissociative radiation B such as ultraviolet light (UV) or electron beam (EB) to cure the radiation polymerizable compound contained in the adhesive layer 3. When the radiation polymerizable compound contained in the adhesive layer 3 is polymerized to cure it by irradiating the adhesive layer 3 with radiation, the adhesion force of the adhesive contained in the adhesive layer 3 greatly decreases, leaving only a slight adhesion force.

The irradiation to the adhesive sheet 1 is preferably effected from the side of the substrate 2 on which the adhesive layer 3 is not formed. Accordingly, as mentioned previously, the substrate 2 must be light transmittable when UV is used as the radiation to be irradiated, but the substrate 2 need not always be light transmittable when EB is used as the radiation to be irradiated.

In the manner now described, the portions of the adhesive layer 3 on which the wafer chips $A_1$, $A_2$... are provided is irradiated with radiation to lower the adhesion force of the adhesive layer 3. Thereafter, the adhesive sheet 1 having this adhesive layer 3 is transferred to a pick-up station (not shown) wherein the chip $A_1$... is pushed up according to the usual way from the back side of the substrate 2 by means of a pushing rod 5, and the pushed-up wafer chips $A_1$, $A_2$... are picked up, for example, by means of an air pincette, and are mounted on a given support substrate. By picking up the wafer chips $A_1$, $A_2$... in this manner, all the wafer chips can be simply picked up without any adhesion of the adhesive to the back side surface of every wafer chip, thereby obtaining chips of good quality free from contamination. Furthermore, the irradiation may be effected in the pick-up station, as well.

Figure 6:
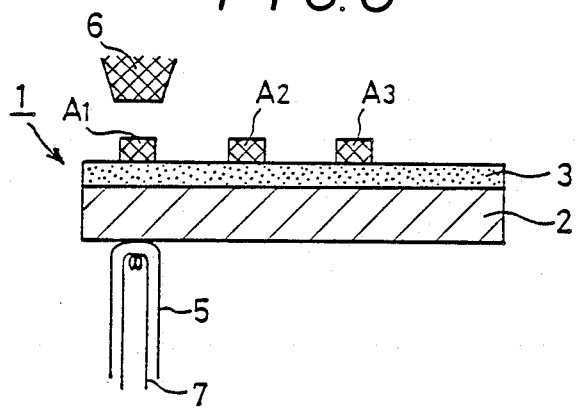

It is not always necessary to effect irradiation at once on the whole surface of the wafer A, and it may be effected partially in several times, for instance, only the portion of the substrate 2 corresponding to each of the wafer chips $A_1$, $A_2$... is irradiated from the back side of the substrate 2 by means of an irradiating tube to lower the adhesion force of the adhesive corresponding to the irradiated portion of the substrate 2, and thereafter the wafer chips $A_1$, $A_2$... are pushed up by means of the pushing rod 5 and then the pushed-up chips are successively picked up from the adhesive sheet 1. FIG. 6 shows a modification of the abovementioned irradiation method, wherein the pushing rod 5 is hollow in the interior thereof and a radiation source 7 is provided in the hollow portion of the pushing rod 5 so that the irradiation and pick up operations can be effected at the same time, thus the apparatus can be simplified and, at the same time, the time necessary for the pick-up operation can be shortened.

In the above-mentioned treatment of semiconductor wafer, the wafer chips $A_1$, $A_2$... may be subjected to pickup treatment immediately after dicing, rinsing, and drying without effecting an expanding operation.

Figure 7:
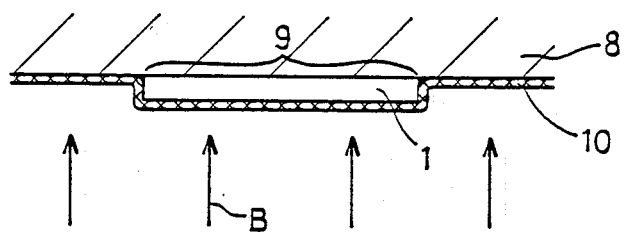
FIG. 7 is an illustration showing said adhesive sheet used in the course of masking for coated products.

The adhesive sheet 1 of the present invention is preferably used in the processing of semiconductor wafers, from dicing operation up to pick-up operation, as illustrated hereinbefore. This adhesive sheet 1 may also be used in masking an object to be coated with coating materials. As shown in FIG. 7, in the case of an object 8 to be coated, for example, an automobile body, onto the surface 9 not to be coated with a coating material is applied the adhesive sheet 1 of the present invention, and a coating 10 is formed on the object 8 to be coated, as it is. Thereafter, the adhesive sheet 1 is irradiated from upside the radiation to lower the adhesion force of said adhesive sheet 1, followed by peeling off the irradiated adhesive sheet 1 from the object 8 to be coated. In this way, there is obtained such an excellent effect that no adhesive will remain or be deposited on the surface of the object 8 to be coated.

The present invention is illustrated below with reference to examples, but it should be recognized that the invention is in no way limited to those examples.

EXAMPLE 1

An adhesive layer forming composition was prepared from a mixture comprising 100 parts of an acrylic adhesive (a copolymer of n-butyl acrylate and 2-ethylhexyl acrylate), 100 parts of a urethane acrylate oligomer having a molecular weight of about 7000 (a product of Dainich Seika Kogyo, K.K., sold under a trade name of SEIKABEAM PU-4), 10 parts of a hardener (a diisocyanate type hardener) and 4 parts of a UV curing initiator (a benzophenone type initiator).

The composition thus prepared was coated on one side of a polypropylene film substrate of 80 μm in thickness in such a manner that an adhesive layer to be formed thereon may have a thickness of 10 μm, and the thus coated substrate was then heated at 100° C. for 1 minute to prepare an adhesive sheet.

Onto the adhesive layer surface of the adhesive sheet thus obtained was applied a silicon wafer having a fairly rough surface of Ra=0.27 as measured in the manner as will be explained below, and an adhesion strength between the wafer and adhesive sheet was measured according to JIS-Z-0237 (180° Peeling Method, 300 mm/min of a peeling speed, 25 mm wide test specimen, measurement in a chamber at 23° C. and 65% RH) whereupon the adhesion strength as measured was 410 g/25 mm.

Surface roughness of the silicon wafer was represented in terms of a centerline average roughness Ra (μm) according to JIS B0601-1976, and the measurement thereof was conducted using "Universal Surface Profile Tester" Model SE-3A manufactured and sold by K.K. Kosaka Seisakusho.

Subsequently, the adhesive layer of this adhesive sheet was irradiated during second with ultraviolet ray (UV) from an air-cooling high pressure mercury lamp (80 W/cm, irradiation distance 10 cm). After the irradiation, an adhesion strength between the silicon wafer and this adhesive sheet was measured, whereupon the adhesion strength as measured decreased to 24 g/25 mm.

So far as a visual inspection was conducted, there was not observed at all any adhesive which had adhered to and remained on the back side surface of the silicon wafer peeled after the irradiation from the adhesive sheet.

The silicon wafer applied onto the adhesive layer of this adhesive sheet was diced into chips of 5 mm square and, after the UV irradiation, the chips were then picked up, whereupon 100 chips out of 100 chips were picked up.

EXAMPLE 2

An adhesive layer forming composition was prepared from a mixture comprising 100 parts of an acrylic adhesive (a copolymer of 2-ethylhexyl acrylate and acrylonitrile), 200 parts of a urethane acrylate oligomer having a molecular weight of about 7000 (a product of Dainichi Seika Kogyo K.K. sold under a trade name of SEIKA-BEAM PU-4), 10 parts of a hardener (a diisocyanate type hardener) and 4 parts of a UV curing initiator (a benzophenone type initiator).

The composition thus prepared was coated on one side of a polypropylene film substrate of 80 μm in thickness in such a manner that an adhesive layer to be formed thereon may have a thickness of 10 μm, and the thus coated substrate was then heated at 100° C. for 1 minute to prepare an adhesive sheet.

Onto the adhesive layer surface of the adhesive sheet thus obtained was applied a silicon wafer having a rough surface of Ra=0.27, and an adhesion strength between the wafer and adhesive sheet was measured before and after UV irradiation in the same manner as in Example 1.

The adhesion strength as measured before the UV irradiation was 230 g/25 mm, and after the UV irradiation was 21 g/25 mm.

So far as a visual inspection was conducted, there was not observed at all any adhesive which had adhered to and remained on the back side surface of the silicon wafer peeled after the irradiation from the adhesive sheet.

The silicon wafer applied onto the adhesive layer of this adhesive sheet was diced after the UV irradiation into chips of 5 mm square, and the chips were then picked up, whereupon 100 chips out of 100 chips were picked up.

COMPARATIVE EXAMPLE 1

An adhesive sheet was prepared in the same manner as in Example 2 except that in place of the urethane acrylate oligomer, 100 parts of pentaerythritol acrylate having a molecular weight of about 580 was used as a radiation polymerizable compound, and an adhesion strength between a silicon wafer of Ra=0.27 applied onto the adhesive layer surface of the thus prepared adhesive sheet and this adhesive sheet was measured before and after a UV irradiation.

The adhesion strength as measured before the UV irradiation was 700 g/25 mm, and after the UV irradiation was 100 g/25 mm.

The silicon wafer applied onto the adhesive layer surface of this adhesive sheet was diced after the UV irradiation into chips of 5 mm square, and the chips were then picked up, whereupon, even 1 chip out of 100 chips could not be picked up.

EXAMPLE 3

Example 1 was repeated except that a silicon wafer having a fine smooth surface of Ra=0.04 was used instead, and an adhesion strength between the wafer and adhesive sheet was measured in like manner before and after UV irradiation.

The adhesion strength as measured before the UV irradiation was 150 g/25 mm, and after the UV irradiation was 6 g/25 mm.

EXAMPLE 4

Example 2 was repeated except that a silicon wafer having a fine smooth surface of Ra=0.04 was used instead, and an adhesion strength between the wafer and adhesive sheet was measured in like manner of Example 2 before and after UV irradiation.

The adhesion strength as measured before the UV irradiation was 50 g/25 mm, and after the UV irradiation was 4 g/25 mm.

COMPARATIVE EXAMPLE 2

Comparative Example 1 was repeated except that a silicon wafer having a fine smooth surface of Ra=0.04 was used instead, and an adhesion strength between the wafer and adhesive sheet was measured in like manner before and after UV irradiation.

The adhesive strength as measured before the UV irradiation was 490 g/25 mm, and after the UV irradiation was 15 g/25 mm.

There was observed the adhesive which had adhered to and remained on the back side surface of the silicon wafer peeled after the UV irradiation from the adhesive sheet.

COMPARATIVE EXAMPLE 3

An adhesive layer forming composition was prepared from a mixture comprising 100 parts of an acrylic adhesive (a copolymer of n-butyl acrylate and 2-ethylhexyl acrylate), 100 parts of a urethane acrylate oligomer (a product of Dainichi Seika Kogyo K.K., sold under a trade name of EX 808) having an average molecular weight of about 1100 which is estimated by the calibration curve using standard polystyrene molecular weight as measured by gel permeation chromatography (GPC), 10 parts of a hardener (a diisocyanate type hardener) and 4 parts of a UV curing initiator (a benzophenone type initiator).

An adhesive sheet was prepared using this composition in the same manner as in Example 1, and was measured an adhesion strength before and after UV irradiation between a silicon wafer having a fairly rough surface of Ra=0.27 and the adhesive sheet thus prepared.

The adhesion strength as measured before the UV irradiation was 320 g/25 mm, and after the UV irradiation was 75 g/25 mm.

The silicon wafer applied onto the adhesive layer surface of this adhesive sheet was diced into chips of 5 mm square and, after the UV irradiation the chips were picked up, whereupon only 30 chips out of 100 chips were picked up.

EXAMPLE 5

An adhesive layer forming composition was prepared from a mixture comprising 100 parts of an acrylic adhesive (a copolymer of n-butyl acrylate and acrylic acid), 100 parts of urethane acrylate oligomer (a product of Dainichi Seika Kogyo K.K., sold under a trade name of SEIKA BEAM EX 808), 25 parts of a hardener (a diisocyanate type hardener) and 10 parts of a UV curing initiator (a benzophenone type initiator), said mixture additionally containing 5 parts of 4,4',4"trisdimethylaminotriphenylmethane or a leuco dye as a radiation color developable compound.

The composition thus prepared was coated on one side of a polyethylene film substrate of 80 μm in thickness in such a manner that an adhesive layer to be formed thereon may have a thickness of 10 μm, and the thus coated substrate was then heated at 100° C. for 1 minute to prepare an adhesive sheet.

The adhesive layer of the adhesive sheet thus obtained was irradiated for 2 seconds with ultraviolet radiation (UV) from a air-cooling high pressure mercury lamp (80 W/cm, irradiation distance 10 cm).

By virtue of the UV irradiation, the adhesive sheet which had been transparent assumed bluish-purple color. A color difference E (L* a* B* ) before and after the UV irradiation was measured by means of SM Color Computer (manufactured and sold by Suga Testers K.K.), whereupon the color difference as measured was 26.8.

A silicon wafer applied onto the adhesive layer surface of this adhesive sheet was diced into wafer chips and then subjected to UV irradiation under the conditions mentioned above to detect the wafer chips by means of a photosensor (manufactured and sold under a trade name of SX-23R by Thanks K.K.), whereupon the wafer chips could easily be detected and no error in the picking-up performance was observed.

COMPARATIVE EXAMPLE 4

An adhesive sheet was prepared in the same manner as in Example 5 except that no UV irradiation color developable compound was used, and a color difference of the adhesive sheet owing to UV irradiation was measured in like manner of Example 5.

The color difference E (L* a* b* ) of the irradiated adhesive sheet as measured was less than 2.0, thus no coloration caused by the UV irradiation was observed.

A silicon wafer applied onto the adhesive layer surface of this adhesive sheet was diced into wafer chips and then subjected to UV irradiation to effect detection of the wafer chips by means of a photosensor, whereupon a failure of detection was partly observed. Further, the wafer chips were picked up while using the photosensor, whereupon an error of the picking-up performance was partly observed.

EXAMPLE 6

An adhesive sheet was prepared in the same manner as in Example 5 except that in place of the urethane acrylate oligomer, there was used pentaerythritol acrylate having a molecular weight of about 580, and a color difference of the adhesive sheet owing to UV irradiation was measured in like manner.

The color difference E (L* a* b* ) of the adhesive sheet as measured before and after the UV irradiation was 25.0.

A silicon wafer applied onto the adhesive layer surface of this adhesive sheet was diced into wafer chips and then subjected to UV irradiation under the conditions mentioned above to effect detection of the wafer chips by means of a photosensor, whereupon the wafer chips could be detected without failure in detection. Further, the wafer chips were picked up while using the photosensor, whereupon no error in the pick-up performance was observed at all.

EXAMPLE 7

To 100 parts by weight of an undercoating composition comprising a vinyl acetate-vinyl chloride copolymer as a principal ingredient was added 5 parts by weight of 4,4',4"trisdimethylaminophenylmethane as a UV irradiation color developable leuco dye. The resulting undercoating composition was coated and dried on one side of a polyethylene terephthalate film substrate of 50 μm in thickness in such manner that an undercoat layer to be formed thereon may have a dry thickness of 1-2 μm.

On the undercoat layer thus formed was coated and dried, a mixture comprising 100 parts by weight of an acrylic adhesive (a copolymer of n-butyl acrylate and acrylic acid), 100 parts by weight of a urethane acrylate oligomer having a molecular weight of 3,000-10,000, 25 parts by weight of a hardener (a diisocyanate type hardener) and 10 parts by weight of a UV irradiation curing initiator (a benzophenone type initiator) so as to form an adhesive layer having a dry thickness of 10 μm, and the thus coated substrate was heated at 100° C. for 1 minute to obtain an adhesive sheet of a triple-layer structure according to the present invention.

The adhesive layer of the adhesive sheet thus obtained was irradiated for 2 seconds with ultraviolet radiation (UV) from an air-cooling high pressure mercury lamp (80 W/cm, irradiation distance 10 cm). By virtue of the UV irradiation, the adhesive sheet which had been transparent assumed bluish purple color. A color difference E(L* a* b* ) of the adhesive sheet at the time of UV irradiation was measured by means of SM Color Computer (manufactured and sold by Suga Testers K.K.), whereupon the color difference as measured was 21.6.

Furthermore, a silicon water applied onto the adhesive layer surface of this adhesive sheet was diced into wafer chips and then subjected to UV irradiation under the conditions mentioned above to effect detection of the wafer chips by means of a photosensor, whereupon the wafer chips could easily be detected. The wafer chips were then picked up while using the photosensor, whereupon no error in the picking-up performance was observed at all.

COMPARATIVE EXAMPLE 5

An adhesive sheet was prepared in the same manner as in Example 7 except that an undercoat layer capable of coloration on UV irradiation was formed on the substrate, and a color difference of the adhesive sheet which is due to UV irradiation was measured. The color difference E (L* a* b* ) of the adhesive sheet as measured before and after the UV irradiation was less than 2.0, thus no coloration due to the UV irradiation was observed.

Further, a silicon wafer applied onto the adhesive layer surface of this adhesive sheet was diced into wafer chips and then subjected to UV irradiation to effect detection of the wafer chips by means of a photosensor, whereupon the detection could not be performed sufficiently in some cases.

Furthermore, the wafer chips were picked up while using the photosensor, whereupon, error in the picking-up performance was observed in some cases.

EXAMPLE 8

An adhesive layer forming composition was prepared from a mixture comprising 100 parts of an acrylic adhesive (a copolymer of n-butyl acrylate and 2-ethylhexyl acrylate), 100 parts of a urethane acrylate oligomer having a molecular weight of about 7,000 (a product of Dainichi Seika Kogyo K.K., sold under a trade name of SEIKABEAM PU-4), 1 part of a hardener (a diisocyanate hardener) and 3 parts of a UV curing initiator (a benzophenone type initiator), said mixture additionally containing 2.5 parts of silica fine particles (produced and sold by Degsa Co., OK-412).

The composition thus prepared was coated on one side of a polypropylene film substrate of 80 $\mu$m in thickness in such a manner that an adhesive layer to be formed thereon may have a thickness of 10 $\mu$m, and the thus coated substrate was heated at 100° C. for 1 minute to prepare an adhesive sheet.

Onto the adhesive layer surface of the adhesive sheet thus prepared was applied a black melamine plate, as an imaginary silicon wafer, having approximately the same diameter and thickness as in the silicon wafer, and an adhesion strength between the melamine plate and adhesive sheet was measured according to JIS-Z-0237 (180° Peeling Method, peeling speed 300 mm/min, a width of the test specimen 25 mm, measurement in a chamber at 23° C. and 65% RH), whereupon the adhesion strength as measured was 1500 g/25 mm.

Subsequently, the adhesive layer surface of this adhesive sheet was irradiated for 1 second with ultraviolet radiation (UV) from an air-cooling high pressure mercury lamp (80 W/cm, irradiation distance 10 cm). An adhesion strength between the black melamine plate and adhesive sheet was measured after the UV irradiation, whereupon the adhesion strength as measured decreased to 15–20 g/25 mm.

When the back side surface of the melamine plate peeled from the adhesive layer was visually inspected, whereupon there was not observed at all any adhesive which had adhered to and remained on said surface.

COMPARATIVE EXAMPLE 6

An adhesive sheet was prepared in the same manner as in Example 8 except that no silica fine particles were incorporated in the adhesive layer forming composition, and an adhesion strength between the black melamine plate and adhesive sheet before and after UV irradiation was measured.

The adhesion strength as measured before the UV irradiation was 1,700 g/25 mm, and after the UV irradiation was 500–1,000 g/25 mm.

The back side surface of the black melamine plate peeled after the UV irradiation from the adhesive sheet retained large amount of the adhesive which had adhered to and remained thereon.

EXAMPLE 9

An adhesive sheet was prepared in the same manner as in Example 8 except that in place of the urethane acrylate oligomer, dipentaerythritol monohydroxypentaacrylate having a molecular weight of 700 was used as a radiation polymerizable compound, and an adhesion strength between the black melamine plate applied onto the adhesive layer surface of the adhesive sheet thus prepared and this adhesive sheet was measured in like manner before and after UV irradiation.

The adhesion strength as measured before the UV irradiation was 1400 g/25 mm, and after the UV irradiation was 80 g/25 mm.

No adhesive which had adhered to and remained was observed on the back side surface of the black melamine plate peeled after the UV irradiation from the adhesive sheet.

EXAMPLE 10

Example 8 was repeated except that a white melamine plate was used as an imaginary silicon wafer, and an adhesion strength between the white melamine plate and adhesive sheet before and after UV irradiation was measured in like manner.

The adhesion strength as measured before the UV irradiation was 1700 g/25 mm, and after the UV irradiation was 6 g/25 mm.

When visually inspected, no adhesive which had adhered to and remained on the back side surface of the melamine plate peeled after the UV irradiation from the adhesive sheet was observed at all.

EXAMPLE 11

Example 9 was repeated except that a white melamine plate was used as an imaginary silicon wafer, and an adhesion strength between the white melamine plate and adhesive sheet before and after UV irradiation was measured in like manner.

The adhesion strength as measured before the UV irradiation was 1400 g/25 mm in the same way as in Example 9, and after the UV irradiation was 30 g/25 mm.

When visually inspected, no adhesive which had adhered to and remained on the back side surface of the melamine plate peeled after the UV irradiation from the adhesive sheet was observed at all.

COMPARATIVE EXAMPLE 7

Comparative Example 6 was repeated except that a white melamine plate was used as an imaginary silicon wafer, and adhesion strength between the white melamine plate and adhesive sheet before and after UV irradiation was measured in like manner.

The adhesive strength as measured before the UV irradiation was 1700 g/25 mm in the same way as in Comparative Example 6, and after the UV irradiation was 9 g/25 mm.

EXAMPLE 12

An adhesive layer forming composition was prepared from a mixture comprising 100 parts by weight of an acrylic adhesive (a copolymer of n-butyl acrylate and acrylic acid), 100 parts by weight of a urethane acrylate oligomer having a molecular weight of 3,000-10,000, 25 parts by weight of a hardener (a diisocyanate type hardener) and 10 parts by weight of a UV curing initiator (a benzophenone type initiator).

The adhesive forming composition thus prepared was coated on one side of an electron radiation crosslinked polyethylene substrate of 50 $\mu$m in thickness in such a manner that an adhesive layer to be formed on the substrate may have a dry thickness of 10 $\mu$m, and the thus coated substrate was heated at 100° C. for 1 minute to prepare an adhesive sheet.

Onto the adhesive layer surface of the adhesive sheet thus obtained was applied a silicon wafer and diced, thereafter the state of the adhesive sheet was visually inspected, whereupon a deflection or the like was not observed in the sheet. The adhesive sheets prepared in the manner now described could all be received smoothly by a container box. After having been received by the container box, no contact between the sheets was observed. Even after having been irradiated with ultraviolet irradiation, no deflection was observed in the sheets in which the adhesion strength between the silicon wafer and adhesive sheet was decreased, no deflection was observed likewise and the sheets were received by the container box smoothly without causing contact between the sheets. Furthermore, at the time of the subsequent picking-up of the wafer chips, the sheets were assuredly expanded and the accurate positioning of the wafer chips was performed by a sensor, whereby the wafer chips were picked up smoothly.

COMPARATIVE EXAMPLE 8

An adhesive sheet was prepared in the same manner as in Example 12 except that the polyethylene substrate used was not electron radiation crosslinked. A silicon wafer was applied onto the adhesive layer surface of the adhesive sheet thus prepared and diced into wafer chips, followed by UV irradiation, whereupon the substrate underwent deflection after each step of the dicing and UV irradiation and a trouble was caused by mutual contact of the adhesive sheets when they were received by the container box. Furthermore, when the wafer chips were picked up, there was observed an error in the picking-up performance which is considered ascribable to deflection of the substrate.

What is claimed is:

1. An adhesive sheet for use in dicing wafers into chips, comprising a substrate of a synthetic resin film having coated on the surface thereof an adhesive layer comprising an acrylic or methacrylic adhesive and a radiation polymerizable acrylate compound, wherein a radiation color developable compound is coated directly on at least one side of the substrate.

2. The adhesive sheet according to claim 1 wherein the radiation color developable compound is a leuco dye.

3. The adhesive sheet according to claim 1 wherein the leuco dye is 4,4',4"-trisdimethylaminotriphenylmethane.

4. The adhesive sheet according to claim 1 wherein the radiation polymerizable compound is a urethane acrylate oligomer.

5. The adhesive sheet according to claim 4 wherein the radiation polymerizable compound is a urethane acrylate oligomer having a molecular weight of 3,000–10,000.

6. An adhesive sheet for use in dicing wafers into chips, comprising a substrate of a synthetic resin film having coated on the surface thereof an adhesive layer comprising an acrylic or methacrylic adhesive and a radiation polymerizable acrylate compound, wherein a radiation color developable compound is incorporated in the substrate.

7. The adhesive sheet according to claim 6 wherein the radiation color developable compound is a leuco dye.

8. The adhesive sheet according to claim 7 wherein the leuco dye is 4,4',4"-trisdimethylaminotriphenylmethane.

9. The adhesive sheet according to claim 6 wherein the radiation polymerizable compound is a urethane acrylate oligomer.

10. The adhesive sheet according to claim 9 wherein the radiation polymerizable compound is a urethane acrylate oligomer having a molecular weight of 3,000–10,000.

* * * * *